(12) United States Patent
Koo et al.

(10) Patent No.: US 9,099,328 B2
(45) Date of Patent: Aug. 4, 2015

(54) COMPLEMENTARY SPIN DEVICE HAVING A GATE, A SOURCE, A FIRST AND SECOND DRAIN ELECTRODE

(71) Applicant: KOREA INSTITUTE OF SCIENCE AND TECHNOLOGY, Seoul (KR)

(72) Inventors: Hyun Cheol Koo, Seoul (KR); Hyung-Jun Kim, Seoul (KR); Joon Yeon Chang, Seoul (KR); Jun Woo Choi, Busan (KR); Suk Hee Han, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/052,129

(22) Filed: Oct. 11, 2013

(65) Prior Publication Data
US 2014/0264514 A1    Sep. 18, 2014

(30) Foreign Application Priority Data
Mar. 14, 2013    (KR) .......................... 10-2013-0027349

(51) Int. Cl.
*H01L 21/02*    (2006.01)
*H01L 29/08*    (2006.01)
(Continued)

(52) U.S. Cl.
CPC ...... *H01L 29/0673* (2013.01); *H01L 29/41725* (2013.01); *H01L 29/66984* (2013.01); *H01L 29/4238* (2013.01)

(58) Field of Classification Search
CPC . H01L 27/22; H01L 27/092; H01L 27/11502; H01L 27/11507; H01L 28/55; H01L 29/82; B82Y 25/00

USPC .............. 257/295, 421, 422, E29.323, 40, 43, 257/195; 438/3
See application file for complete search history.

(56) References Cited

U.S. PATENT DOCUMENTS 5,847,993 A * 12/1998 Dejenfelt ................... 365/185.1
7,307,875 B2 * 12/2007 Johnson ....................... 365/158
(Continued)

FOREIGN PATENT DOCUMENTS

JP    2007-299992 A    11/2007
JP    2008-060905 A    3/2008
(Continued)

OTHER PUBLICATIONS

Y. Saito, et al; "Spin-Based MOSFET and Its Applications", Journal of the Electrochemical Society, vol. 158, pp. H1068-H1076, Published Aug. 9, 2011.
(Continued)

*Primary Examiner* — Long K Tran
*Assistant Examiner* — Dzung Tran
(74) *Attorney, Agent, or Firm* — Ladas & Parry LLP

(57) ABSTRACT

A complementary device including a gate electrode, a channel, a source electrode connected to the gate electrode and the channel, and a first drain electrode and a second drain electrode connected to the gate electrode and the channel is provided. The first/second drain electrode is formed so that, in accordance with a voltage applied to the gate electrode, electron spins injected into the source electrode are moved from the source electrode to the first/second drain electrode through the channel while rotating in a first/second direction. Directions of the electron spins that reach the first drain electrode and the second drain electrode are opposite to each other.

17 Claims, 6 Drawing Sheets

(51) Int. Cl.
*H01L 29/66* (2006.01)
*H01L 29/82* (2006.01)
*H01L 29/06* (2006.01)
*H01L 29/417* (2006.01)
*H01L 29/423* (2006.01)

(56) References Cited

U.S. PATENT DOCUMENTS

| | | | |
|---|---|---|---|
| 7,939,869 B2 | 5/2011 | Tsuchiaki et al. | |
| 2008/0149911 A1* | 6/2008 | Karg et al. | 257/4 |
| 2008/0169492 A1* | 7/2008 | Koo et al. | 257/295 |
| 2009/0200592 A1* | 8/2009 | Tsuchiaki et al. | 257/295 |
| 2010/0176428 A1* | 7/2010 | Hong et al. | 257/295 |
| 2011/0279146 A1* | 11/2011 | Koo et al. | 326/100 |

FOREIGN PATENT DOCUMENTS

| | | |
|---|---|---|
| JP | 2009188230 A | 8/2009 |
| JP | 2011-040678 A | 2/2011 |
| KR | 101084019 B1 | 11/2011 |

OTHER PUBLICATIONS

Christoph Brüne, et al; "Spin polarization of the quantum spin Hall edge states", Nature Physics, vol. 8, pp. 485-490; Published online May 27, 2012.

Pham Man Hai, et al; "Reconfigurable Logic Gates Using Single-Electron Spin Transistors", Retrieved online: arxiv.org/pdf/0707. 1922; Submitted on Jul. 13, 2007; 31 pages.

* cited by examiner

FIG. 6

| Vg=V1 | PART 1 | PART 2 |
|---|---|---|
| MAGNETIZATION DIRECTIONS OF DRAIN ELECTRODES | → | → |
| DIRECTIONS OF ELECTRON SPINS MOVED TO DRAIN ELECTRODES | ← | → |
| SWITCHING OF TRANSISTOR | OFF | ON |

| Vg=V2 | PART 1 | PART 2 |
|---|---|---|
| MAGNETIZATION DIRECTIONS OF DRAIN ELECTRODES | → | → |
| DIRECTIONS OF ELECTRON SPINS MOVED TO DRAIN ELECTRODES | → | ← |
| SWITCHING OF TRANSISTOR | ON | OFF |

COMPLEMENTARY SPIN DEVICE HAVING A GATE, A SOURCE, A FIRST AND SECOND DRAIN ELECTRODE

CROSS-REFERENCE TO RELATED APPLICATION

This application claims priority to and the benefit of Korean Patent Application No. 10-2013-0027349 filed in the Korean Intellectual Property Office on Mar. 14, 2013, the entire contents of which are incorporated herein by reference.

BACKGROUND OF THE INVENTION (a) Field of the Invention

The present invention relates to a complementary spin device and method for operation. More particularly, the present invention relates to a complementary device that may be realized using rotation directions of electron spins.

(b) Description of the Related Art

Recently, researches using not only charge characteristics but also spin characteristics of electrons have been actively performed. The above is referred to as spintronics. A representative spin device is a spin transistor the concept of which was introduced by Datta and Das in 1990. The spin transistor is spotlighted as a high speed, non-volatile, low power, and highly integrated device. Recently, various researches on a logic device have been performed based on the spin transistor.

A representative logic circuit is one using a complementary device. A conventional complementary metal oxide semiconductor (CMOS) transistor is formed such that a P-channel metal-oxide-semiconductor (MOS) transistor and an N-channel MOS transistor are insulated from each other and are put into the same chip. The complementary device has a high switching speed and low power consumption. However, when the complementary device is formed as described above, the complementary device is not easily realized and down-sized.

The above information disclosed in this Background section is only for enhancement of understanding of the background of the invention and therefore it may contain information that does not form the prior art that is already known in this country to a person of ordinary skill in the art.

SUMMARY OF THE INVENTION

According to the present invention, a complementary device that may be realized using electron spin is provided.

A complementary device according to an exemplary embodiment of the present invention includes a gate electrode, a channel, a source electrode connected to the gate electrode and the channel, and a first drain electrode and a second drain electrode connected to the gate electrode and the channel. The first drain electrode is formed so that, in accordance with a voltage applied to the gate electrode, electron spins injected into the source electrode are moved from the source electrode to the first drain electrode through the channel while rotating in a first direction. The second drain electrode is formed so that, in accordance with the voltage applied to the gate electrode, the electron spins injected into the source electrode are moved from the source electrode to the second drain electrode through the channel while rotating in a second direction. Directions of the electron spins that reach the first drain electrode and the second drain electrode are opposite to each other. Here, since the directions of the electron spins moved to the first drain electrode and the second drain electrode are opposite to each other, rotation directions are opposite to each other. The first direction and the second direction are opposite to each other, the source electrode receives electron spins aligned in a predetermined direction, and the first drain electrode and the second drain electrode are separated from the source electrode by the same distance to be positioned opposite to each other. The complementary device may further include a first transistor including the gate electrode, the source electrode, and the first drain electrode, and a second transistor including the gate electrode, the source electrode, and the second drain electrode. The first transistor is in an ON state when a magnetization direction of the first drain electrode and a direction of electron spins moved to the first drain electrode are same, and the first transistor is in an OFF state when the magnetization direction of the first drain electrode and the direction of the electron spins moved to the first drain electrode are opposite. The second transistor is in an ON state when a magnetization direction of the second drain electrode and a direction of electron spins moved to the second drain electrode are same, and the second transistor is in an OFF state when the magnetization direction of the second drain electrode and the direction of the electron spins moved to the second drain electrode are opposite.

In a complementary device including a gate electrode, a channel, a source electrode connected to the gate electrode and the channel, and a first drain electrode and a second drain electrode connected to the gate electrode and the channel, separated from the gate electrode by the same distance to be positioned opposite to each other, and separated from the source electrode in the same distance to be positioned opposite to each other, a method of realizing the complementary device according to an exemplary embodiment of the present invention includes, in accordance with a voltage applied to the gate electrode, moving electron spins injected into the source electrode from the source electrode to the first drain electrode through the channel while rotating in a first direction, and, in accordance with a voltage applied to the gate electrode, moving electron spins injected into the source electrode from the source electrode to the second drain electrode through the channel while rotating in a second direction. Directions of the electron spins that reach the first drain electrode and the second drain electrode are opposite to each other. The first direction and the second direction are opposite to each other, and the method may further include receiving electron spins aligned on the source electrode in a predetermined direction. The complementary device may further include a first transistor including the gate electrode, the source electrode, and the first drain electrode, and a second transistor including the gate electrode, the source electrode, and the second drain electrode. The first transistor is in an ON state when a magnetization direction of the first drain electrode and a direction of electron spins moved to the first drain electrode are same, and the first transistor is in an OFF state when the magnetization direction of the first drain electrode and the direction of the electron spins moved to the first drain electrode are opposite. The second transistor is in an ON state when a magnetization direction of the second drain electrode and a direction of electron spins moved to the second drain electrode are same, and the second transistor is in an OFF state when the magnetization direction of the second drain electrode and the direction of the electron spins moved to the second drain electrode are opposite.

A complementary device according to an exemplary embodiment of the present invention includes a channel, a rectangular source electrode positioned on the channel, a rectangular first drain electrode positioned on the channel at one side of the source electrode and extended to run parallel with a longer side of the source electrode, a rectangular second drain electrode positioned on the channel at one side of the source electrode and extended to run parallel with a longer side of the source electrode, and a rectangular gate electrode positioned on the source electrode, the first drain electrode, and the second drain electrode to intersect a longer side of the source electrode. The first drain electrode and the second drain electrode are positioned at the same distance from the source electrode. In accordance with a voltage applied to the gate electrode, electron spins injected into the source electrode are moved from the source electrode to the first drain electrode through the channel in a first direction, and spins injected into the source electrode are moved from the source electrode to the second drain electrode through the channel in a second direction. Directions of the electron spins that reach the first drain electrode and the second drain electrode are opposite to each other. The first direction and the second direction are opposite to each other and the source electrode receives electron spins aligned in a predetermined direction. The complementary device may further include a first transistor including the gate electrode, the source electrode, and the first drain electrode, and a second transistor including the gate electrode, the source electrode, and the second drain electrode. The first transistor is in an ON state when a magnetization direction of the first drain electrode and a direction of electron spins moved to the first drain electrode are same, and the first transistor is in an OFF state when the magnetization direction of the first drain electrode and the direction of the spins moved to the first drain electrode are opposite. The second transistor is in an ON state when a magnetization direction of the second drain electrode and a direction of spins moved to the second drain electrode are same, and the second transistor is in an OFF state when the magnetization direction of the second drain electrode and the direction of the electron spins moved to the second drain electrode are opposite.

The directions of the electron spins that reach the first drain electrode and the second drain electrode are opposite to each other.

According to the present invention, a high speed, non-volatile, low power, and highly integrated device may be realized by the directions of the electron spins that are spin characteristics of the electrons.

BRIEF DESCRIPTION OF THE DRAWINGS

FIG. 6 is a view illustrating a complementary device according to the present invention realized by comparing magnetization directions of drain electrodes with directions of spins moved to the drain electrodes in accordance with a voltage applied to a gate electrode.

DETAILED DESCRIPTION OF THE EMBODIMENTS

Figure 1:
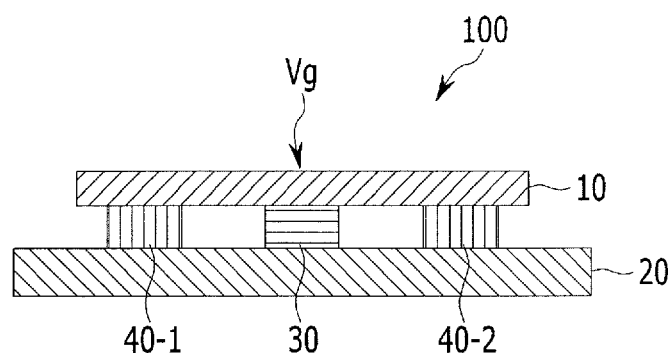
FIG. 1 is a view schematically illustrating a complementary device according to an exemplary embodiment of the present invention seen from the side.

When a part is referred to as being "on" another part, it may be directly on the other part or intervening parts may also be present. To the contrary, when a part is referred to as being "immediately on" another part, intervening parts are not present.

The terms, first, second, third, etc. are used for describing various parts, components, regions, layers, and/or sections, however they are not limited to the above. The terms are used only for distinguishing certain parts, components, regions, layers, or sections from other parts, components, regions, layers, or sections. Therefore, a first part, component, region, layer, or section described hereinafter may be referred to as a second part, component, region, layer, or section without departing from the scope of the present invention.

Technical terms used hereinafter are only for describing a specific exemplary embodiment and are not for limiting the present invention. Singular types used hereinafter include plural types unless explicitly described to the contrary. The meaning of "including" used in the specification specifies specific characteristics, regions, integers, processes, operations, elements, and/or components, and does not exclude presence or addition of other characteristics, regions, integers, steps, operations, elements, and/or components.

Terms that represent a relative space such as "under" and "on" may be used for more easily describing a relationship between an illustrated part and other parts in the drawings. The terms are intended to include other meanings or operations of a used apparatus together with the meaning intended in the drawings. For example, when the apparatus in the drawings is reversed, certain parts described to be "under" other parts are described to be "on" the other parts. Therefore, an exemplary term, "under" includes both upper and lower directions. The apparatus may be rotated by 90° or other angles, and the terms that represent a relative space are interpreted in accordance with the above.

Unless they are defined otherwise, all terms including technical terms and scientific terms used hereinafter have the same meanings as those commonly understood by those skilled in the art. The terms defined in a commonly used dictionary are additionally interpreted as having meanings suitable for related technical documents and currently disclosed contents, and are not to be interpreted as ideal or to have very formal meanings unless otherwise defined.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

FIG. 1 is a view schematically illustrating a complementary device 100 according to an exemplary embodiment of the present invention seen from the side. A structure of the complementary device 100 of FIG. 1 is only for describing the present invention, and the present invention is not limited thereto. Therefore, the structure of the complementary device 100 may vary.

The complementary device 100 includes a gate electrode 10, a channel 20, a source electrode 30, a first drain electrode 40-1, and a second drain electrode 40-2. As occasion demands, the complementary device 100 may further include other devices.

Referring to FIG. 1, a horizontal length of the channel 20 seen from the side is larger than a vertical height thereof, and the thickness, length, and height of the channel 20 are not limited.

The source electrode 30 is formed on the channel 20 at an approximate horizontal center of the channel 20. The first drain electrode 40-1 and the second drain electrode 40-2 are positioned to face each other on either side of the source electrode 30. The first drain electrode 40-1 and the second drain electrode 40-2 are separated from the source electrode 30 by the same distance.

The gate electrode 10 is formed on the source electrode 30, the first drain electrode 40-1, and the second drain electrode 40-2. A horizontal length of the gate electrode 10 seen from the side is larger than a vertical height thereof. In FIG. 1, it is illustrated that the horizontal length of the gate electrode 10 is shorter than the horizontal length of the channel 20. However, the present invention is not limited to the above.

Figure 2:
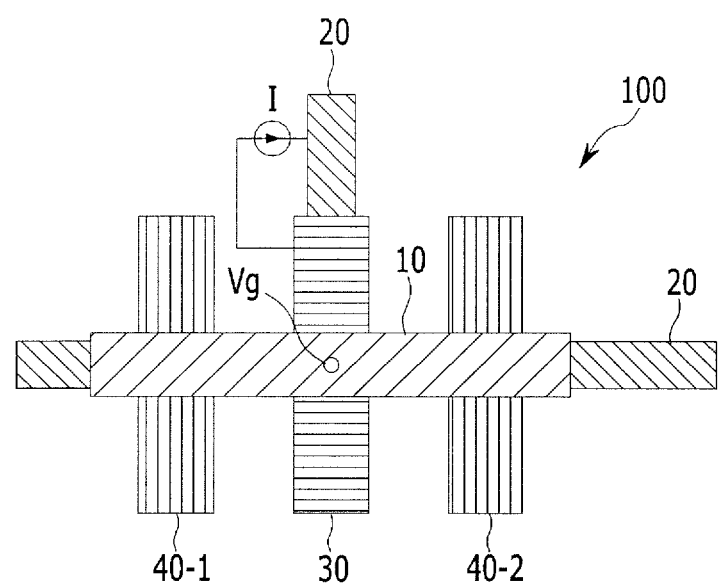
FIG. 2 is a view schematically illustrating the complementary device of FIG. 1 seen from above.

FIG. 2 is a view schematically illustrating the complementary device 100 of FIG. 1 seen from above.

Referring to FIG. 2, a length of the source electrode 30 is greater than a width thereof, and the length of the source electrode 30 is formed to intersect the gate electrode 10.

As illustrated in FIG. 2, a current flows from the source electrode 30 to the channel 20.

By flowing the current as described above, electron spins injected into the source electrode 30 are moved to the first drain electrode 40-1 and the second drain electrode 40-2 while rotating. A detailed description of this will be given later.

A length of each of the first drain electrode 40-1 and the second drain electrode 40-2 is larger than a width thereof. Lengths of the first drain electrode 40-1 and the second drain electrode 40-2 are formed to run approximately parallel with the length of the source electrode 30.

A length of the gate electrode 10 is larger than that a width thereof, and the length of the gate electrode 10 intersects the length of the source electrode 30. However, the number of gate electrodes and the type of gate electrodes are not limited to the above. When occasion demands, another type may be available. The gate electrode 10 is formed on the source electrode 30, the first drain electrode 40-1, and the second drain electrode 40-2, and a gate voltage Vg is applied to a top of the source electrode (to an approximate center of the gate electrode 10).

The gate electrode 10 controls electron spin rotations in accordance with the gate voltage Vg applied to the gate electrode 10. To be specific, since rotation speeds of the electron spins vary with a voltage applied to the gate electrode 10, if a length of the channel 20 to which the electron spins are moved is predetermined, when the electron spins are moved from the source electrode 30 to the drain electrodes 40 while rotating, the directions of the electron spins that reach the drain electrodes 40 are determined in accordance with the voltage applied to the gate electrode 10.

A current flows between the channel 20 and the source electrode 30 to function as a path through which the electron spins are moved from the source electrode 30 to the drain electrodes 40. The channel 20 is formed of a two-dimensional electron gas (2DEG). However, the above is only an example, and the material of the channel is not limited to the above.

The source electrode 30 is positioned between the gate electrode 10 and the channel 20, and is connected to both the gate electrode 10 and the channel 20. As described above, the current flows from the source electrode 30 to the channel 20 and the electron spins spinning with a directional nature that are injected into the source electrode 30 through the flowing current are moved to the drain electrodes 40 through the channel 20.

That is, in accordance with the current that flows from the source electrode 30 to the channel 20 and the voltage applied to the gate electrode 10, the electron spins are moved from the source electrode 30 to the drain electrodes 40-1 and 40-2 through the channel 20 while rotating.

To be specific, the electron spins injected into the source electrode 30 rotate by the Rashba effect, and rotate in a clockwise direction or a counterclockwise direction in accordance with the spinning directions of the electron spins. That is, as illustrated in FIG. 3, the electron spins moved to the left rotate in a counterclockwise direction and the electron spins moved to the right rotate in a clockwise direction.

The electron spins aligned in the same predetermined direction are injected into the source electrode 30 according to the present invention. The electron spins spinning in the same direction are injected into the source electrode 30 because, as described above, the electron spins moved to the drain electrodes 40-1 and 40-2 are rotated by a predetermined degree from the direction of the electron spins injected into the source electrode 30 in accordance with the voltage applied to the gate electrode 10. In order to realize a complementary device using the directions of the electron spins moved to the drain electrodes 40-1 and 40-2, the directions of the electron spins from the source electrode 30 before being moved must be the same.

Figure 3:
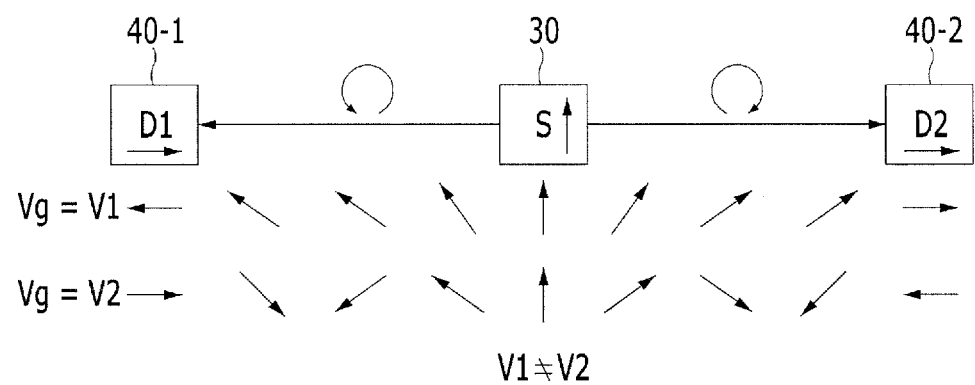
FIG. 3 is a view schematically illustrating an operation of a complementary device when a complementary device according to an exemplary embodiment of the present invention is seen from the side.

FIG. 3 is a view illustrating a schematic operation of a complementary device when a complementary device according to an exemplary embodiment of the present invention is seen from the side.

Referring to FIG. 3, as described above, electron spins moved from the source electrode 30 to the first drain electrode 40-1 are moved while rotating in the counterclockwise direction, and electron spins moved from the source electrode 30 to the second drain electrode 40-2 are moved while rotating in the clockwise direction.

When the electron spins injected into the source electrode 30 are aligned in a 12 o'clock direction, when rotations of the electron spins are controlled by a predetermined gate voltage V1, the electron spins moving toward the first drain electrode 40-1 are rotated by 90° in the counterclockwise direction so that the electron spins moving toward the first drain electrode 40-1 are in a 9 o'clock direction.

In addition, the electron spins moving toward the second drain electrode 40-2 are rotated 90° in the clockwise direction so that the electron spins moving toward the second drain electrode 40-2 are in a 3 o'clock direction.

In a case where the electron spins injected into the source electrode 30 are aligned in the 12 o'clock direction, when the rotations of the spins are controlled by a predetermined gate voltage V2 different from the gate voltage V1, the electron spins moving toward the first drain electrode 40-1 are rotated 270° in the counterclockwise direction so that the electron spins moving to the first drain electrode 40-1 are in the 3 o'clock direction. In addition, the electron spins moving toward the second drain electrode 40-2 are rotated 270° in the clockwise direction so that the electron spins moved to the second drain electrode 40-2 are oriented in the 9 o'clock direction.

Here, V1 and V2 may be different voltages, and for example, V1=0V and V2=1V. However, the present invention is not limited to the above. In addition, the electron spins injected into the source electrode 30 are not necessarily aligned in the 12 o'clock direction.

Figure 4:
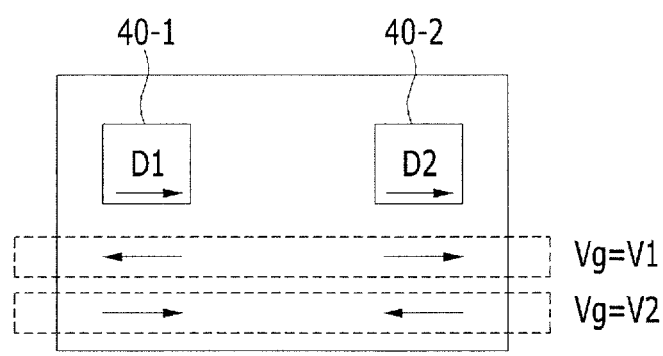
FIG. 4 is a view schematically illustrating a direction of spin moved to a first drain electrode and a second drain electrode and magnetization directions of the first drain electrode and the second drain electrode in accordance with the operation of FIG. 3.

FIG. 4 is a view schematically illustrating a direction of electron spins having moved to the first drain electrode 40-1 and the second drain electrode 40-2 and magnetization directions of the first drain electrode and the second drain electrode in accordance with the operation of FIG. 3.

Referring to FIG. 4, electrons spinning in a fixed direction are positioned at the first drain electrode 40-1 and the second drain electrode 40-2. The fixed spin directions of electrons positioned at the drain electrodes are referred to as magnetization directions of the drain electrodes. In FIG. 4, both the first drain electrode 40-1 and the second drain electrode 40-2 have magnetization directions in the 3 o'clock direction. However, the present invention is not limited to the above.

In FIG. 4, the electron spins injected into the source electrode 30 are aligned in the 12 o'clock direction, but the directions of the electron spins injected into the source electrode 30 are not limited to the above.

When the gate voltage Vg is V1, the electron spins moved to the first drain electrode 40-1 are aligned in the 9 o'clock direction and the electron spins moved to the second drain electrode 40-2 are aligned in the 3 o'clock direction. In this case, as described above, since the magnetization direction of the first drain electrode 40-1 is the 3 o'clock direction, the direction of the electron spins moved to the first drain electrode 40-1 and the magnetization direction of the first drain electrode 40-1 are in an anti-parallel state and the direction of the electron spins moved to the second drain electrode 40-2 and the magnetization direction of the second drain electrode 40-2 are in a parallel state.

When the gate voltage Vg is V2, the direction of the electron spins moved to the first drain electrode 40-1 is the 3 o'clock direction and the direction of the spins moved to the second drain electrode 40-2 is the 9 o'clock direction. In this case, as described above, since the magnetization direction of the first drain electrode 40-1 is the 3 o'clock direction, the direction of the electron spins moved to the first drain electrode 40-1 and the magnetization direction of the first drain electrode 40-1 are in the parallel state, and the direction of the electron spins moved to the second drain electrode 40-2 and the magnetization direction of the second drain electrode 40-2 are in the anti-parallel state.

Figure 5:
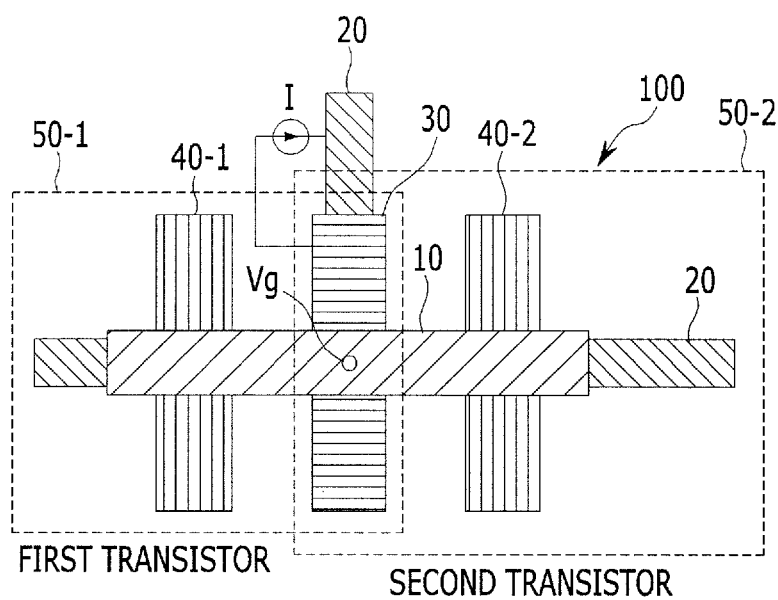
FIG. 5 is a view illustrating a complementary device according to an exemplary embodiment of the present invention as two transistors of a first transistor and a second transistor.

FIG. 5 is a view illustrating the complementary device 100 according to an exemplary embodiment of the present invention as two transistors of a first transistor 50-1 and a second transistor 50-2.

As illustrated in FIG. 5, the first transistor 50-1 includes the first drain electrode 40-1, the source electrode 30, and the gate electrode 10. The second transistor 50-2 includes the second drain electrode 40-2, the source electrode 30, and the gate electrode 10. Here, there may be multiple gate electrodes, but in the drawing, one gate electrode is illustrated. However, the present invention is not limited to the above.

The magnetization directions of the first drain electrode 40-1 and the second drain electrode 40-2, and the directions of the electron spins moved to the first drain electrode 40-1 and the second drain electrode 40-2 may be compared with each other so that the comparison results may correspond to ON/OFF of the first transistor 50-1 and the second transistor 50-2, or binary 1/0. Therefore, the complementary device 100 according to the present invention may function as a switch and a logic circuit using turn-on and turn-off states of the first transistor 50-1 and the second transistor 50-2.

FIG. 6 is a view illustrating a complementary device 100 according to the present invention realized by comparing magnetization directions of drain electrodes with directions of electron spins moved to the drain electrodes in accordance with a voltage applied to a gate electrode.

As described above, when the voltage applied to the gate electrode 10 is V1, the magnetization direction of the first drain electrode 40-1 and the direction of the electron spins moved to the first drain electrode 40-1 are in an anti-parallel state and the magnetization direction of the second drain electrode 40-2 and the direction of the electron spins moved to the second drain electrode 40-2 are in a parallel state. In addition, when the voltage applied to the gate electrode 10 is V2, the magnetization direction of the first drain electrode 40-1 and the direction of the electron spins moved to the first drain electrode 40-1 are in a parallel state and the magnetization direction of the second drain electrode 40-2 and the direction of the spins moved to the second drain electrode 40-2 are in an anti-parallel state.

When the magnetization direction of the first drain electrode 40-1 and the direction of the electron spins moved to the first drain electrode 40-1 or the magnetization direction of the second drain electrode 40-2 and the direction of the electron spins moved to the second drain electrode 40-2 are in the parallel state, a switching state of a transistor may be "ON". When the magnetization direction of the first drain electrode 40-1 and the direction of the electron spins moved to the first drain electrode 40-1 or the magnetization direction of the second drain electrode 40-2 and the direction of the electron spins moved to the second drain electrode 40-2 are in the anti-parallel state, the switching state of the transistor may be "OFF".

The above will be illustrated in the following table.

TABLE 1

| Vg | V 1 | V 2 |
|---|---|---|
| First transistor | OFF | ON |
| Second transistor | ON | OFF |

As noted from the Table 1, in accordance with the gate voltage Vg applied to the gate electrode 10, switching states of the first transistor 50-1 and the second transistor 50-2 may be opposite to each other. Therefore, it is noted that the complementary device may be realized using the spins of the electrons.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: gate electrode
20: channel
30: source electrode
40-1, 40-2: first drain electrode, second drain electrode
50-1, 50-2: first transistor, second transistor

What is claimed is:
1. A complementary device, comprising:
a gate electrode;
a channel;
a source electrode connected to the gate electrode and the channel; and
a first drain electrode and a second drain electrode connected to the gate electrode and the channel,
wherein the first drain electrode is formed so that, in accordance with a voltage applied to the gate electrode, elec- tron spins injected into the source electrode are moved from the source electrode to the first drain electrode through the channel while rotating in a first direction, wherein the second drain electrode is formed so that, in accordance with the voltage applied to the gate electrode, the electron spins injected into the source electrode are moved from the source electrode to the second drain electrode through the channel while rotating in a second direction, and wherein directions of the electron spins that reach the first drain electrode and the second drain electrode are opposite to each other, wherein the source electrode, the first drain electrode, and the second drain electrode are positioned between the gate and the channel.

2. The complementary device of claim 1, wherein the source electrode, the first drain electrode and the second drain electrode are substantially parallel to each other.

3. The complementary device of claim 2, wherein the source electrode receives electron spins aligned in a predetermined direction.

4. The complementary device of claim 3, wherein the first drain electrode and the second drain electrode are separated from the source electrode by the same distance to be positioned opposite to each other.

5. The complementary device of claim 1, further comprising:
a first transistor including the gate electrode, the source electrode, and the first drain electrode; and
a second transistor including the gate electrode, the source electrode, and the second drain electrode.

6. The complementary device of claim 5, wherein:
the first transistor is in an ON state when a magnetization direction of the first drain electrode and a direction of electron spins moved to the first drain electrode are same, and the first transistor is in an OFF state when the magnetization direction of the first drain electrode and the direction of the electron spins moved to the first drain electrode are different; and
the second transistor is in an ON state when a magnetization direction of the second drain electrode and a direction of electron spins moved to the second drain electrode are same, and the second transistor is in an OFF state when the magnetization direction of the second drain electrode and the direction of the electron spins moved to the second drain electrode are different.

7. A complementary device, comprising:
a channel;
a rectangular source electrode positioned on the channel;
a rectangular first drain electrode positioned on the channel at one side of the source electrode and extended to run parallel with a longer side of the source electrode;
a rectangular second drain electrode positioned on the channel at another side of the source electrode and extended to run parallel with the longer side of the source electrode; and
a rectangular gate electrode positioned on the source electrode, the first drain electrode, and the second drain electrode to intersect a longer side of the source electrode,
wherein the first drain electrode and the second drain electrode are positioned at the same distance from the source electrode,
wherein, in accordance with a voltage applied to the gate electrode, electron spins injected into the source electrode are moved from the source electrode to the first drain electrode through the channel in a first direction, wherein, in accordance with a voltage applied to the gate electrode, electron spins injected into the source electrode are moved from the source electrode to the second drain electrode through the channel in a second direction, and wherein directions of the electron spins that reach the first drain electrode and the second drain electrode are opposite to each other, wherein the source electrode, the first drain electrode, and the second drain electrode are positioned between the gate and the channel.

8. The complementary device of claim 7, wherein the source electrode, the first drain electrode, and the second drain electrode are perpendicular to the channel.

9. The complementary device of claim 8, wherein the source electrode receives electron spins aligned in a predetermined direction.

10. The complementary device of claim 7, further comprising:
a first transistor including the gate electrode, the source electrode, and the first drain electrode; and
a second transistor including the gate electrode, the source electrode, and the second drain electrode.

11. The complementary device of claim 10, wherein:
the first transistor is in an ON state when a magnetization direction of the first drain electrode and a direction of electron spins moved to the first drain electrode are same, and the first transistor is in an OFF state when the magnetization direction of the first drain electrode and the direction of the electron spins moved to the first drain electrode are different, and
the second transistor is in an ON state when a magnetization direction of the second drain electrode and a direction of electron spins moved to the second drain electrode are same, and the second transistor is in an OFF state when the magnetization direction of the second drain electrode and the direction of the electron spins moved to the second drain electrode are different.

12. A complementary device comprising:
a channel;
a source on the channel;
a first drain on the channel;
a second drain on the channel; and
a gate on the source, the first drain, and the second drain,
wherein the gate and the channel are parallel to each other,
wherein the source, the first drain and the second drain are between the gate and the channel,
wherein, in accordance with a first voltage applied to the gate, electron spins injected into the source are moved from the source to the first drain through the channel in a first direction,
wherein, in accordance with a second voltage applied to the gate, electron spins injected into the source are moved from the source to the second drain through the channel in a second direction, and
wherein directions of the electron spins that reach the first drain and the second drain are opposite to each other.

13. The complementary device of claim 12, wherein the source, the first drain, and the second drain are rectangular shaped and are parallel to each other, and the source, the first drain and the second drain are perpendicular to the gate and the channel.

14. The complementary device of claim 12, wherein the first drain and the second drain are separated from the source by the same distance to be positioned opposite to each other.

15. The complementary device of claim 12, wherein the source receives electron spins aligned in a predetermined direction.

16. The complementary device of claim 12, wherein
the source, the first drain, and a portion of the channel comprises a first transistor; and
the source, the second drain and another portion of the channel comprises a second transistor.

17. The complementary device of claim 16, wherein:
the first transistor is in an ON state when a magnetization direction of the first drain and a direction of electron spins moved to the first drain are the same, and the first transistor is in an OFF state when the magnetization direction of the first drain and the direction of the electron spins moved to the first drain are different; and
the second transistor is in an ON state when a magnetization direction of the second drain and a direction of electron spins moved to the second drain are same, and the second transistor is in an OFF state when the magnetization direction of the second drain and the direction of the electron spins moved to the second drain are different.

* * * * *